United States Patent
Mertens et al.

(12)

(10) Patent No.: US 6,303,522 B1
(45) Date of Patent: Oct. 16, 2001

(54) OXIDATION IN AN AMBIENT COMPRISING OZONE AND THE REACTION PRODUCTS OF AN ORGANIC CHLORO-CARBON PRECURSOR

(75) Inventors: Paul Mertens, Haacht; Marc Heyns, Linden, both of (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 09/193,887

(22) Filed: Nov. 18, 1998

Related U.S. Application Data

(63) Continuation-in-part of application No. 08/980,107, filed on Nov. 26, 1997.
(60) Provisional application No. 60/066,160, filed on Nov. 19, 1997.

(51) Int. Cl.$^7$ .................................................. H01L 21/31
(52) U.S. Cl. ............................................................ 438/774
(58) Field of Search ..................................... 438/774, 784, 438/787, FOR 399, FOR 494

(56) References Cited

U.S. PATENT DOCUMENTS

| 5,288,662 | 2/1994 | Lagendijk et al. . |
| 5,599,425 | 2/1997 | Lagendijk et al. . |
| 5,721,176 | 2/1998 | McGeary et al. . |

FOREIGN PATENT DOCUMENTS

| 0 577 262 B1 | 10/1996 | (EP) . |
| 3231472-A | * 10/1991 | (JP) . |

OTHER PUBLICATIONS

B.Y. Nguyen et al., "Insitu Pyrochemical Wafer Cleaning For Furnace Processing," Tech. Dig. 1993 Symp., on VLSI Technol. (ISAP, Tokyo, 1993), p. 109.
DeBusk, Damon et al., "Investigating a Trans–dichloroethylene Vapor Cleaning Process," Micro., Sep. 1995, p. 39.

* cited by examiner

Primary Examiner—George Fourson
Assistant Examiner—Michelle Estrada
(74) Attorney, Agent, or Firm—Knobbe, Martens, Olson and Bear LLP

(57) ABSTRACT

The present invention is related to an efficient thermal oxidation process that allows the controlled growth of in-situ cleaned high quality thin oxides on a silicon-containing substrate. Said oxidation is performed in an ambient comprising at least the reaction products of a chloro-carbon precursor and ozone. This thermal oxidation is preferably executed at low temperatures, being preferably below 500° C., in order to limit the in-diffusion of metal surface contaminants is limited. The present invention is further related to the decomposition of organic chloro-carbon precursors at low temperatures by the introduction of ozone prior to the actual oxidation step.

17 Claims, 1 Drawing Sheet

US 6,303,522 B1

OXIDATION IN AN AMBIENT COMPRISING OZONE AND THE REACTION PRODUCTS OF AN ORGANIC CHLORO-CARBON PRECURSOR

This application is a continuation-in-part of Application No. 08/980,107, filed Nov. 26, 1997, and also claims the priority of Provisional Application No. 60/066,160, filed Nov. 19, 1997 under Title 35, United States Code §119(e).

BACKGROUND OF THE INVENTION

1. Field of the Invention

The present invention is related to thermal oxidation processes at low temperatures These processes can be used during the manufacturing of semiconductor devices. Specific examples of use of such processes are the growth of thin oxide layers down to 0.1 nm, the Cl-cleaning of a substrate and the temperature ramp-up prior to the oxide growth during a rapid thermal oxidation process.

2. Description of the Related Technology

In thermal oxidation processes an aim is to grow $SiO_2$ films by exposing silicon to $O_2$ at elevated temperatures. Historically chlorine has been introduced in the oxidation ambient in order to improve the electronic quality of gate oxide layers. Studies have revealed that the improvements by introducing chlorine are in fact initiated by the presence of $Cl_2$. Particularly, the reduction of electronic instabilities, attributed to the presence of mobile ions, mainly Na, has been emphasized. In addition, the use of Cl during gate oxidation was also found to result in a reduction of the density of dielectric breakdown defects and of stacking faults. It has been demonstrated that metal contamination on the wafer surface prior to gate oxidation has a distinct negative effect on the dielectric integrity of thin oxides. Particularly Ca has been identified as one of the most detrimental metals in that respect. The introduction of Cl in the oxidation ambient was found to be very efficient in removing metal contaminants, especially Ca, from the silicon wafer surface. In order to meet the stringent future gate-oxide defect density requirements, the residual concentration of metals and of Ca in particular has to be further reduced.

Most oxidation tools are now equipped for the introduction of chlorine species during silicon wafer oxidation and/or in situ tube cleaning operations. Several precursors have been used to introduce chlorine. In order to compare these different methods a common parameter describing the concentration of the total amount of Cl fed to the reactor chamber, irrespective of its chemical state, is introduced. Said parameter is the "chlorine-equivalent concentration of a given Cl-precursor" and is defined as the ratio between "the total flow of Cl atoms [number of Cl atoms per unit time] to the process chamber" and "the total flow of all molecules [number of molecules per unit time] to the process chamber".

In the past it was common practice to feed HCl gas to the oxidation furnace. Although this gas was effective for this application, its use has several drawbacks. Because of its corrosive nature, this gas deteriorates the metal distribution lines as well as the metal components in the gas management system. Such corrosion phenomena result in highly undesirable metallic contamination of the gasses. Moreover the handling of the pressurized gas cylinders requires special care.

Because of these drawbacks the industry has used 1,1,1-trichloroethane (TCA) as the precursor for Cl in the furnace. TCA is a volatile liquid and can be introduced into process tools via Teflon™ tubing thereby avoiding the corrosion phenomena faced with HCl. Since TCA has been identified as an ozone depleting substance, attacking the stratospheric ozone layer, its production, use and/or transportation has been restricted or even banned.

In response the industry has come up with ozonelayer-friendly replacement substances for TCA such as trans-1,2-dichloroethylene (DCE) and oxalyl chloride (OC). The replacement with DCE is the subject of the U.S. Pat. No. 5,288,662. The replacement with OC is the subject of the European Patent EP 0 577262 B1. However for instance U.S. Pat. No. 5599425 clearly states (column 1, lines 10–35 and especially lines 33–35) that organic chlorine precursors are typically not used as chlorine precursors in processes carried out at temperatures below 800° C. U.S. Pat. No. 5599425 suggests the predecomposition of these organic molecules in a pre-burn box.

The ongoing downscaling of CMOS device dimensions, in particular the gate length, demands for an ongoing reduction of the gate oxide thickness in order to meet the required stringent device performance specifications. The realization of this required shrinkage of the thickness of oxide layers with the conservation or preferably even improvement of the quality of these oxide layers, causes severe problems. Amongst others, to obtain a high quality oxide layer, the metal contamination level should be as low as possible.

B. -Y. Nguyen et al, in Tech. Dig. 1993 Symp. on VLSI Technol., (JSAP, Tokyo, 1993) p. 109 is related to a so-called "pyro-clean" process. In this process an in-situ low temperature Cl-treatment prior to the gate oxidation process is used. The motivation for this process is based on the fact that the diffusion constant and the solubility of a number of metals in silicon increases strongly with increasing temperature. The purpose of this process is to remove metallic contamination before the onset of diffusion of metal into bulk silicon. Typically a 30 minutes treatment at 650° C. is performed using an inert (e.g. $N_2$) ambient containing $O_2$ at a volume concentration of 2%. As a Cl precursor, HCl was chosen. As mentioned above, the use of the corrosive gas, HCl, in this process leads to potential danger of corrosion of the gas distribution system and is therefore undesirable.

U.S. Pat. No. 5480492 is related to the removal of contaminants from the silicon substrate surface by exposure to a gas including ozone at a temperature not less than 750° C. However, the conditions are such that oxidation of the silicon substrate surface is prevented, in other words no oxide layer is formed.

U.S. Pat. No. 5589422 is related to the removal of metal contaminants from the silicon substrate surface by exposure to an ozone ambient. An oxide layer is formed and subsequently removed prior to the formation of a structural oxide layer.

U.S. 5330935 is related to the formation of silicon dioxide films by lowtemperature plasma oxidation employing a mixture of oxygen and ozone. However, as stated in column 1, lines 25–30 of this paten, it is known that thin silicon dioxide films formed by thermal oxidation have a higher quality as films formed by plasma oxidation. U.S. Pat. No. 5330935 further states that contemporary state-of-the-art thermal oxidation processes are limited to the high temperature regime, i.e. typically in excess of 900° C.

SUMMARY OF THE INVENTION

It is an aim of the present invention to provide an efficient thermal oxidation process that allows the controlled growth of in-situ cleaned high quality thin oxides on a silicon-containing substrate. Said oxidation is performed in an ambient comprising at least the reaction products of a chloro-carbon precursor and ozone.

A further aim of the present invention is to execute thermal oxidation at low temperatures, being preferably below 500° C. By doing so, the in-diffusion of metal surface contaminants is limited.

A further aim of the invention is to decompose the organic chlorine-carbon in an ambient comprising ozone prior to the actual oxidation step.

Still a further aim of the invention is the cleaning of a surface of a silicon-containing substrate by thermal oxidation of said surface at low temperature, being preferably below 500° C. in an ambient comprising at least ozone and the reaction products of an organic chloro-carbon precursor. The oxide film formed can be removed or not.

In an aspect of the invention a method is disclosed of in situ cleaning a silicon substrate by heating a silicon-containing substrate in a gas phase ambient comprising $Cl_2$ and ozone. This chlorine is generated by a chloro-carbon precursor. Particularly a very low concentration of ozone, typically a volume concentration between 1% and 50% or below can be used. The heating can be performed in a furnace being either a conventional furnace or in a rapid thermal oxidation tool. The aim of this in situ Cl-clean is to remove the metal surface contaminants before they can diffuse into the substrate. Therefore, preferably the temperature in the furnace is typically in the range from room temperature to 500° C. or from 100° C. to 400° C. Heating steps are typically in the range up to 30 minutes or higher in case of conventional thermal oxidation or typically some tenths of seconds in case of a rapid thermal oxidation. The silicon oxide layer formed with this cleaning method can eventually be removed afterwards.

In another aspect of the invention a method is disclosed of in-situ cleaning and growing a first silicon oxide layer on a silicon-containing substrate by means of thermal oxidation, said method comprising the steps of: providing an organic chloro-carbon precursor; providing ozone; reacting said ozone with said chloro-carbon precursor to thereby generate reaction product; heating said substrate in a furnace while exposing said substrate to a first gaseous mixture, said first gaseous mixture comprising said reaction products; holding said substrate in said furnace to thereby in-situ clean said substrate until said first silicon oxide layer on said substrate is formed. The heating can be performed in a furnace being a conventional furnace or a rapid thermal oxidation tool. The aim of this in situ clean and growth process is to remove the majority of the metal surface contaminants before they can diffuse into the substrate and at the same form a high quality thin silicon oxide layer, as e.g. a $SiO_2$ layer on said silicon-containing substrate. Therefore, preferably the temperature in the furnace is typically in the range from room temperature to 500° C. or from 100° C. to 400° C., or from room temperature to about 700° C. Heating steps are typically in the range up to 30 minutes or higher in case of conventional thermal oxidation or typically some tenths of seconds in case of a rapid thermal oxidation.

The gaseous mixture can further comprise oxygen and/or other reaction products of ozone and the chloro-carbon precursor. The gaseous mixture can also further comprise an inert carrier gas, e.g. $N_2$. The chloro-carbon precursor is preferably a chemical substance which is selected to completely combust under the stated conditions and has a chemical formula $C_xCl_yO_zH_t$, x and y being each one of 1, 2, 3 or 4 and, z and t being each one of 0, 1, 2, 3 or 4 and t being smaller than or equal to y. Examples of such chloro-carbon precursors are oxalyl chloride or DCE. Using the method of the present invention a controlled growth of a thin silicon oxide layer on a silicon substrate can be achieved yielding a thickness of said silicon oxide layer typically in the range from 0.1 to 3 nm. In an embodiment of the invention, said ozone in said furnace is generated by irradiating oxygen with an UV light source.

In another embodiment of the invention, a method is disclosed for growing a thin silicon oxide layer on a silicon substrate comprising at least two steps. In a first step a first part of a silicon oxide layer is formed by a first thermal oxidation step in a furnace comprising a first gaseous mixture, said first gaseous mixture comprising ozone and $Cl_2$, said $Cl_2$ being generated by an organic chloro-carbon precursor. Afterwards, without removing said first part of said silicon oxide layer, a second thermal oxidation step is performed in a furnace comprising a second gaseous mixture, said second gaseous mixture comprising ozone and $Cl_2$, said $Cl_2$ being generated by an organic chloro-carbon precursor to thereby grow a second part of said silicon oxide layer. During said second step, said substrate is at a temperature typically in the range from 500° C. to 1000° C. This second thermal oxidation step is performed at a temperature typically in the range up to 30 minutes or higher, but the invention is not limited thereto. In particular even oxidation times in the order of seconds may be used as e.g. for a rapid thermal oxidation process. Using this method a controlled growth of a high quality thin silicon oxide layer on a silicon-containing substrate can be achieved yielding a thickness of said silicon oxide layer in the range from 0.1 to 8 nm or above 8 nm.

In still a further aspect of the invention a method is disclosed of decomposing an organic chloro-carbon precursor prior to the growth of an silicon oxide layer on a silicon-containing substrate by thermal oxidation, comprising the steps of: providing an organic chloro-carbon precursor; providing ozone; decomposing said organic chloro-carbon precursor by reacting ozone with said organic chloro-carbon precursor to thereby generate at least chlorine at a temperature of 500° C. or below. This decomposition can be performed in a separate chamber of a multi-chamber furnace. The reaction products formed can be used in a subsequent thermal oxidation step.

DETAILED DESCRIPTION OF THE PREFERRED EMBODIMENT

Figure 1:
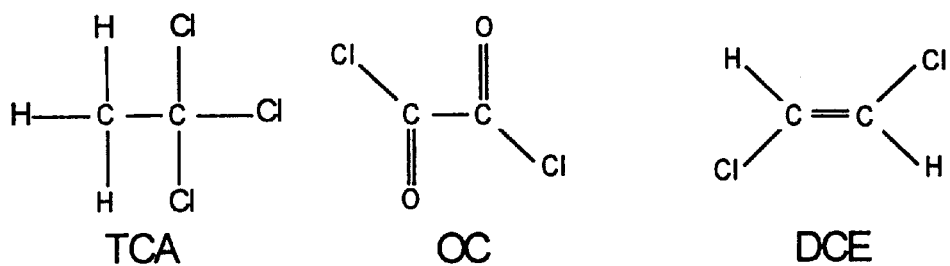
FIG. 1 presents the chemical structures of TCA, OC and DCE.

In a preferred embodiment of the invention a method is disclosed for in-situ cleaning and growing a first silicon oxide layer on a silicon-containing substrate by means of a thermal oxidation step in a furnace comprising a gaseous mixture, said gaseous mixture comprising at least ozone and $Cl_2$, said $Cl_2$ being generated by an organic chloro-carbon precursor. The substrate can be a wafer or a slice of a siliconcontaining material. This gaseous mixture can further comprise oxygen. This in-situ Cl-clean and oxide growth can take place in a furnace being a reaction chamber of a multichamber tool or a separate chamber of said tool or even in a conventional oxidation furnace. Amongst others, the organic chloro-carbon precursor is selected based on the following requirements:

The chloro-carbon precursor should readily combust, preferably even at temperatures in the range from room temperature to 500° C.

The chloro-carbon precursor should be efficient amongst others to allow a good control of the oxidation rate, even at low oxygen concentration and to limit the Cl consumption which is both beneficial for the processing costs as well as for the environment. A chloro-carbon precursor being efficient means that an equivalent performance is obtained at much lower Cl-equivalent concentrations and thus typically a low stoichiometric amount of oxygen is required for the combustion of the Cl-precursor than for conventional precursors. An efficient precursor converts all of its Cl or at least a large fraction of its Cl into $Cl_2$.

Preferably, the chlorine-carbon-precursor should have a non-corrosive nature, contrary to e.g. HCl, and should preferably not attack the stratospheric ozone layer.

The chloro-carbon precursor should easily interact with ozone in a controllable way. The chloro-carbon precursor is preferably a chemical substance which is selected to completely combust under the stated conditions and has a chemical formula $C_xCl_yO_zH_t$, x and y being each one of 1, 2, 3 or 4 and, z and t being each one of 0, 1, 2, 3 or 4 and t being smaller than or equal to y. Examples of such chloro-carbon precursors are oxalyl chloride and DCE. Taking the aforementioned requirements into account, the most appropriate example of such a Cl-precursor is oxalyl chloride because at first oxalyl chloride contrary to e.g. DCE or TCA can still completely combust at a temperature below 500° C. in an ambient comprising $O_2$, i.e. without ozone. When using a chloro-carbon precursor, it is obvious that this can result in a partial combustion, which is undesirable. Some early attempts in performing this process using TCA or DCE have even resulted in deposition of soot on the furnace wall and on the substrate surfaces, which is not possible when using OC. Moreover, even in an ambient with a high percentage of $O_2$ (even up to 100%), each of these substances has a minimum oxidation temperature below which a complete combustion is not possible. This minimum temperature is 800° C. for TCA, about 700° C. for DCE and as low as 400° C. for OC. As stated before, the use of the corrosive gas, HCl, is undesirable due to the potential danger of corrosion of the gas distribution system. As a consequence even for OC a complete combustion below 400° C. in an ambient comprising $O_2$ is not feasible. Therefore, at low temperatures e.g. 400° C. or below, or at 500° C. or below or even at 700° C., according to the present invention, at least part of said $O_2$ should be replaced by or converted to ozone ($O_3$) because ozone very easily reacts with OC and also with DCE. At second, OC has the benefit that it is far more efficient than DCE and TCA. The chemistry for OC is substantially different from that for either one of TCA or DCE. Because OC contains no hydrogen, all the Cl in the precursor can be made available as $Cl_2$, provided of course that water is not deliberately added. In contrast, as in HCl itself, in the TCA and DCE molecules the number of hydrogen atoms equals the number of chlorine atoms. Therefore, during combustion, TCA and DCE are precursors for HCl. As a result, only a fraction of the so formed hydrogen chloride is (further) oxidized to form $Cl_2$. It is obvious that said fraction depends on the parameters which affect the thermodynamical equilibrium like the percentage $O_2$ and $O_3$ in the gaseous mixture.

Therefore the method of the present invention uses a gas phase ambient comprising the reaction products of ozone ($O_3$) and said organic Cl-carbon precursor (preferably OC or DCE). Said reaction products comprise $Cl_2$. An aim of this in-situ clean and growth process is to remove the majority of the metal surface contaminants before they can diffuse into the substrate and at the same form a high quality thin silicon oxide layer, as e.g. a $SiO_2$ layer on said silicon-containing substrate. The diffusion constant and the solubility of a number of metals in silicon increases strongly with increasing temperature. Furthermore, the ability to reduce processing temperatures in the creation of silicon oxides is important since it minimizes dopant diffusion and also reduces stress in the oxide layer formed. Therefore, preferably the temperature in the furnace is typically in the range from room temperature to 500° C. or from 100° C. to 400 ° C., or from room temperature to about 700° C. Heating steps are typically in the range up to 30 minutes or higher in case of conventional thermal oxidation or typically in the order of seconds or some tens of seconds in case of a rapid thermal oxidation. Furthermore, particularly a low Cl-equivalent concentration of the Cl-carbon precursor, preferably oxalyl chloride, in the gas phase ambient can be used combined with a very low concentration of ozone, typically a volume concentration between 1% and 50% or below. The concentration of oxalyl chloride can be in the range of about 0.001% to 0.3 %. Said concentration of oxalyl chloride can also be in the range of 0.3% to 0.5% or in the range of about 0.5%–1%. Higher concentrations can also be used. Using the method of the invention a controlled growth of a thin silicon oxide layer on a silicon substrate can be achieved yielding a thickness of said silicon oxide layer typically in the range from 0.1 to 5 nm or from 0.1 to 3 nm. Such ultra-thin oxide layers are e.g. grown to provide a well defined interface layer for poly-emitters in bipolar devices in order to guarantee a sharp transition between the polycrystalline emitter layer and the monocrystalline substrate, or to define insulating spacers or as gate dielectric for VLSI FET's or as a sub-layer of a gate dielectric layer, e.g. a so-called oxide-nitride-oxide layer or an oxide- oxynitride-oxide layer.

Figure 2:
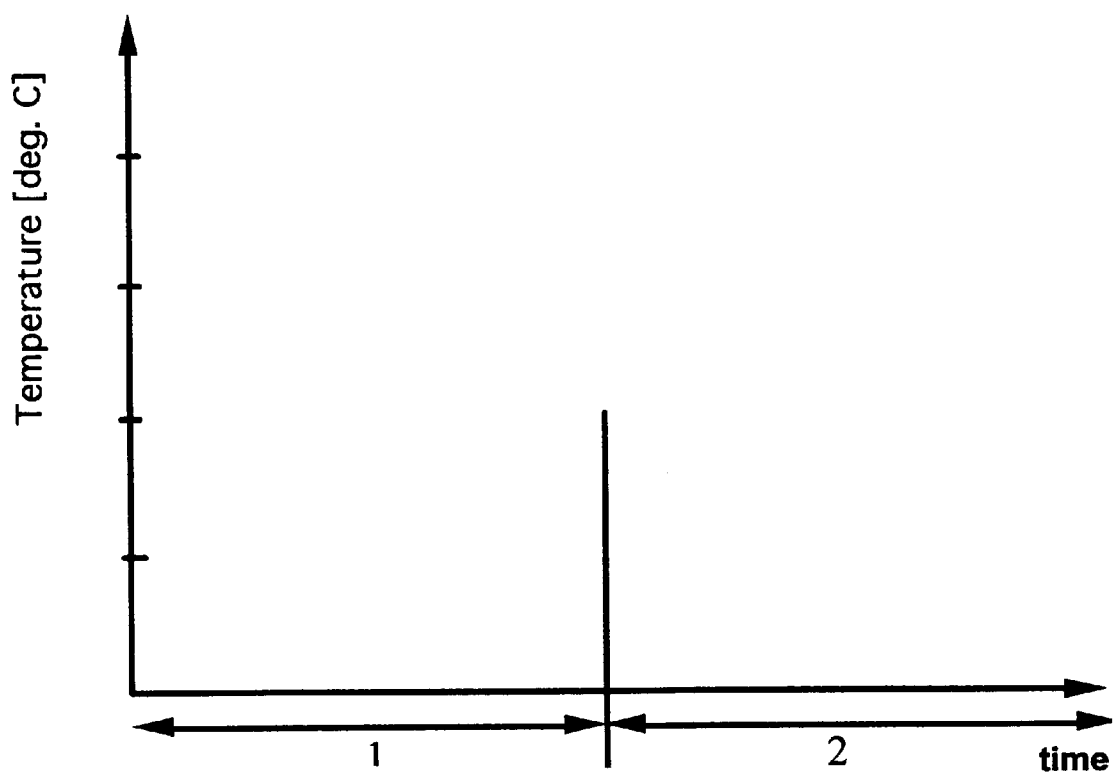
FIG. 2 presents a scheme of the reactor temperature versus the time of a simplified exemplary rapid thermal oxidation process according to an embodiment of the invention.

In another embodiment of the invention, a method is disclosed for growing a thin silicon oxide layer on a silicon substrate comprising at least two steps. In a first step a first part of a silicon oxide layer is formed by a first thermal oxidation step in a furnace comprising a first gaseous mixture, said first gaseous mixture comprising ozone and $Cl_2$, said $Cl_2$ being generated by an organic chloro-carbon precursor. Preferably OC or DCE is used. Said substrate is at a temperature in the range from room temperature to 500° C. or from 100° C. to 400° C. Such a first step, e.g. step (1) in FIG. 2, can be performed prior to the real oxidation step, e.g. step (2) in FIG. 2, as for instance in a rapid thermal oxidation process. Afterwards, without removing said first part of said silicon oxide layer, a second thermal oxidation step is performed in a furnace comprising a second gaseous mixture, said second gaseous mixture comprising ozone and $Cl_2$, said $Cl_2$ being generated by an organic chloro-carbon precursor to thereby grow a second part of said silicon oxide layer. Preferably OC is used. During said second step, said substrate is at a temperature typically in the range from 500° C to 1000° C. This second thermal oxidation step is performed in a time period typically in the range up to 30 minutes or higher, but the invention is not limited thereto. In particular even oxidation times in the order of seconds may be used as e.g. for a rapid thermal oxidation process (2) (FIG. 2). Using this method a controlled growth of a high quality thin silicon oxide layer on a silicon-containing substrate can be achieved yielding a thickness of said silicon oxide layer in the range from 0.1 to 8 nm or above 8 nm.

In still a further embodiment of the invention a method is disclosed of dry cleaning a silicon substrate in a gas phase ambient comprising $Cl_2$ and preferably a low concentration of oxygen and where said ambient is irradiated with an ultraviolet (UV) light source to thereby form ozone. Said $Cl_2$ is generated by an organic Cl-carbon precursor, which is selected based among other things on its efficiency and on its combustion properties as already described above. Therefore, the preferred Cl-carbon precursor is oxalyl chloride but also other Cl-carbon precursors like DCE can be used. The aim of this UV excited dry cleaning is to remove the metal surface contaminants before they can diffuse into the substrate. This is typically done at a temperature of 500° C. or below.

What is claimed is:

1. A method of in-situ cleaning and growing a first silicon oxide layer on a silicon-containing substrate by means of thermal oxidation, said method comprising the steps of:

providing an organic chloro-carbon precursor, the organic chloro-carbon precursor capable of undergoing complete combustion in the presence of ozone at a temperature of from room temperature to about 500° C.;

providing ozone;

reacting said ozone with said chloro-carbon precursor at a temperature of 500° C. or below to completely combust said chloro-carbon precursor, thereby generating reaction products;

heating said substrate in a furnace while exposing said substrate to a first gaseous mixture, said first gaseous mixture comprising said reaction products;

holding said substrate in said furnace to thereby in-situ clean said substrate until said first silicon oxide layer on said substrate is formed.

2. A method as recited in claim 1, wherein said chloro-carbon precursor is a chemical substance which is selected to completely combust under the stated conditions and has a chemical formula $C_xCl_yO_zH_t$, x and y being each one of 1, 2, 3 or 4 and z and t being each one of 0, 1, 2, 3 or 4 and t being smaller than or equal to y.

3. A method as recited in claim 1, wherein said chlorine precursor is oxalyl chloride having the formula $C_2Cl_2O_2$ or DCE having the formula $H_2C_2Cl_2$.

4. A method as recited in claim 1, wherein said furnace is kept at a temperature of 500° C. or below while flowing said first gaseous mixture into said furnace.

5. A method as recited in claim 1 wherein said first silicon oxide layer has a thickness in the range selected from 0.1 nm to 3 nm.

6. A method as recited in claim 1, wherein said first gaseous mixture further comprises oxygen.

7. A method as recited in claim 1, wherein said reaction products comprise $Cl_2$.

8. A method as recited in claim 1, wherein the volume concentration of said ozone in said first gaseous mixture ranges between 1% and 50%.

9. A method as recited in claim 1, wherein said ozone is generated by irradiating oxygen with a UV light source.

10. A method as recited in claim 1, wherein the step of reacting said ozone with said chloro-carbon precursor is performed in said furnace.

11. A method as recited in claim 1, further comprising the step of thermal oxidizing said substrate in a second gaseous mixture, said second gaseous mixture comprising oxygen and $Cl_2$, said $Cl_2$ being generated by an organic chloro-carbon precursor, to thereby form a second silicon oxide layer on said first silicon oxide layer.

12. A method as recited in claim 11, wherein the step of thermal oxidizing said substrate in said second gaseous mixture is performed at a temperature between 500° C. and 1000° C.

13. A method of in-situ cleaning and growing a silicon oxide layer on a silicon-containing substrate by means of a thermal oxidation, comprising the steps of:

heating said substrate in said furnace;

flowing a gaseous mixture into said furnace, said gaseous mixture comprising ozone and $Cl_2$, said $Cl_2$ being generated by reacting said ozone with an organic chloro-carbon precursor at a temperature of 500° C. or below to completely combust said chloro-carbon precursor;

holding said substrate in said furnace to thereby in-situ clean said substrate until said silicon layer on said substrate is formed.

14. A method of decomposing an organic chloro-carbon precursor prior to the growth of a silicon oxide layer on a silicon-containing substrate by thermal oxidation, comprising the steps of:

providing an organic chloro-carbon precursor;

providing ozone;

completely decomposing said organic chloro-carbon precursor by reacting ozone with said organic chloro-carbon precursor to thereby generate reaction products at a temperature of 500° C. or below.

15. A method as recited in claim 14, wherein said chlorine precursor is a chemical substance which is selected to completely combust under the stated conditions and has a chemical formula $C_xCl_yO_zH_t$, x and y being each one of 1, 2, 3 or 4 and z and t being each one of 0, 1, 2, 3 or 4 and t being smaller than or equal to y.

16. A method as recited in claim 14, wherein said chlorine precursor is oxalyl chloride having the formula $C_2Cl_2O_2$ or DCE having the formula $H_2C_2Cl_2$.

17. A method as recited in claim 14, wherein said reaction products comprise $Cl_2$.

* * * * *